(12) United States Patent
Nakazawa et al.

(10) Patent No.: US 8,436,399 B2
(45) Date of Patent: May 7, 2013

(54) SEMICONDUCTOR DEVICE (75) Inventors: Kazushi Nakazawa, Toyama (JP); Akiyoshi Tamura, Osaka (JP)

(73) Assignee: Panasonic Corporation, Osaka (JP)

( * ) Notice: Subject to any disclaimer, the term of this patent is extended or adjusted under 35 U.S.C. 154(b) by 589 days.

(21) Appl. No.: 12/709,699

(22) Filed: Feb. 22, 2010

(65) Prior Publication Data
US 2010/0224908 A1  Sep. 9, 2010

(30) Foreign Application Priority Data
Mar. 4, 2009 (JP) ................ 2009-051181

(51) Int. Cl.
*H01L 29/66* (2006.01)
(52) U.S. Cl.
USPC .......... 257/195; 257/192; 257/194; 257/197; 257/213; 257/272; 438/199; 438/235; 438/285
(58) Field of Classification Search .......... None
See application file for complete search history.

(56) References Cited

U.S. PATENT DOCUMENTS

| | | |
|---|---|---|
| 2002/0113249 A1 | 8/2002 | Hori et al. |
| 2002/0179932 A1 | 12/2002 | Shibata et al. |
| 2003/0151065 A1* | 8/2003 | Hori et al. ............... 257/194 |
| 2005/0045911 A1 | 3/2005 | Hill et al. |
| 2005/0087762 A1 | 4/2005 | Zampardi et al. |
| 2005/0184310 A1 | 8/2005 | Krutko et al. |
| 2006/0261371 A1 | 11/2006 | Kuroda et al. |
| 2008/0088020 A1 | 4/2008 | Miyajima et al. |
| 2008/0176391 A1 | 7/2008 | Miyamoto et al. |
| 2008/0230806 A1 | 9/2008 | Pan et al. |
| 2008/0296624 A1 | 12/2008 | Murayama et al. |
| 2008/0299714 A1 | 12/2008 | Hsin et al. |
| 2009/0114948 A1 | 5/2009 | Ishida |
| 2009/0230431 A1 | 9/2009 | Murayama et al. |

* cited by examiner

*Primary Examiner* — Kyoung Lee
(74) *Attorney, Agent, or Firm* — McDermott Will & Emery LLP (57) ABSTRACT

A semiconductor device according to the present invention includes a substrate; a nitride semiconductor layer formed above the substrate and having a laminated structure including at least three layers; a heterojunction bipolar transistor formed in a region of the nitride semiconductor layer; and a field-effect transistor formed in a region of the nitride semiconductor layer, the region being different from the region in which the heterojunction bipolar transistor is formed.

18 Claims, 8 Drawing Sheets

SEMICONDUCTOR DEVICE

BACKGROUND OF THE INVENTION (1) Field of the Invention

The present invention relates to semiconductor devices and particularly to a semiconductor device including a heterojunction bipolar transistor and a field-effect transistor.

(2) Description of the Related Art

Currently, an InGaP/GaAs heterojunction bipolar transistor (HBT), which includes an emitter layer made of InGaP having a wide bandgap, is in practical use as a radio-frequency element in an apparatus such as a mobile phone. Recent years have seen much focus given to a Bi-FET, in which a power amplifier including the HBT is controlled using a switching element including a field-effect transistor (FET) integrated on a substrate together with the HBT, and thus there has been an advance in the development of the Bi-FET.

In a general device structure of the Bi-FET, for example, first an FET is disposed on a substrate, and then an HBT on the FET, as shown in US 2005/0184310 (Patent Reference 1). In other words, semiconductor layers in which an FET is disposed are stacked on a substrate, and semiconductor layers in which an HBT is disposed are stacked thereon.

SUMMARY OF THE INVENTION

The Bi-FET will inevitably be required to have higher withstanding voltages and operate at higher temperatures. However, significant enhancement of withstanding voltage or operating temperature of the Bi-FET cannot be expected because of physical limitation of a GaAs element therein.

The present invention, conceived to address this problem, has an object of providing a semiconductor device which includes an HBT and an FET and operates at high voltages and high temperatures.

In order to achieve the object, the semiconductor device according to the present invention includes a substrate; a nitride semiconductor layer formed above the substrate and having a laminated structure including at least three layers; a heterojunction bipolar transistor formed in a region of the nitride semiconductor layer; and a field-effect transistor formed in a region of the nitride semiconductor layer, the region being different from the region in which the heterojunction bipolar transistor is formed.

With this structure, the semiconductor device according to the present invention includes an HBT and an FET including nitride semiconductors and operates at higher voltages and higher temperatures.

Furthermore, the nitride semiconductor layer may include: a first nitride semiconductor layer formed above the substrate; a second nitride semiconductor layer formed on the first nitride semiconductor layer; and a third nitride semiconductor layer formed on the second nitride semiconductor layer, and the semiconductor device may further include: an isolation region which separates each of the first nitride semiconductor layer, the second nitride semiconductor layer, and the third nitride semiconductor layer into a first region in which the heterojunction bipolar transistor is formed and a second region in which the field-effect transistor is formed, the first region and the second region being electrically isolated from each other; a collector electrode of the heterojunction bipolar transistor, the collector electrode being electrically connected to the first nitride semiconductor layer in the first region; a base electrode of the heterojunction bipolar transistor, the base electrode being electrically connected to the second nitride semiconductor layer in the first region; an emitter electrode of the heterojunction bipolar transistor, the emitter electrode being electrically connected to the third nitride semiconductor layer in the first region; a source electrode and a drain electrode of the field-effect transistor, the source electrode and the drain electrode being electrically connected to one of the first nitride semiconductor, the second nitride semiconductor layer, and the third nitride semiconductor layer in the second region; and a gate electrode of the field-effect transistor, the gate electrode being formed on one of the first nitride semiconductor, the second nitride semiconductor layer, and the third nitride semiconductor layer in the second region.

With this structure, the FET of the semiconductor device according to the present invention is formed using the nitride semiconductor layers which also form the collector layer, the emitter layer, and the base layer of the HBT. The semiconductor layers formed on the nitride semiconductor layers which form the FET in the semiconductor device according to the present invention is thus thinner than semiconductor layers in a semiconductor device in which all the nitride semiconductor layers included in the HBT is formed on nitride semiconductor layers which form an FET. This reduces distortion of a wafer due to a lattice mismatch of the semiconductor device according to the present invention. In addition, because this makes the semiconductor layers to be etched in forming the FET thinner, etching is easily controlled for the semiconductor device according to the present invention.

Furthermore, the first nitride semiconductor layer may have n-type conductivity, the second nitride semiconductor layer may have p-type conductivity, the third nitride semiconductor layer may include: a fourth nitride semiconductor layer formed on the second nitride semiconductor layer; and a fifth nitride semiconductor layer formed on the fourth nitride semiconductor layer, the fifth nitride semiconductor layer having a wider bandgap than the fourth nitride semiconductor layer, the source electrode and the drain electrode may be electrically connected to the third nitride semiconductor layer in the second region, and the gate electrode may be formed on the fifth nitride semiconductor layer in the second region.

With this structure, the FET of the semiconductor device according to the present invention is formed using the third nitride semiconductor layer which also forms the emitter layer of the HBT. No semiconductor layer is thus formed on the third nitride semiconductor layer which forms the FET. This reduces distortion of a wafer due to a lattice mismatch of the semiconductor device according to the present invention. In addition, there is no need for etching in forming the FET of the semiconductor device according to the present invention. This means that etching is easily controlled for the semiconductor device according to the present invention.

Furthermore, the second nitride semiconductor layer may include $In_xGa_{1-x}N$, where $0 \leq x \leq 1$.

Furthermore, the fourth nitride semiconductor layer may include GaN, and the fifth nitride semiconductor layer may include AlGaN.

Furthermore, the third nitride semiconductor layer may have a thickness of 50 nm or less. With this structure, increase in emitter resistance of the HBT is prevented for the semiconductor device according to the present invention.

Furthermore, the semiconductor device may further include a backgate electrode of the field-effect transistor, the backgate electrode being electrically connected to the second nitride semiconductor layer in the second region.

With this structure, biasing the backgate electrode reduces leak current flowing between the source electrode and the drain electrode when the FET is off. In addition, when the FET is on, adequately biasing the backgate electrode allows changing a threshold voltage of the FET as necessary.

Furthermore, the first nitride semiconductor layer may include: a low-concentration region in contact with the second nitride semiconductor layer and not in contact with the collector electrode; and a high-concentration region in contact with the collector electrode, the high-concentration region including dopants at a higher concentration than the low-concentration region.

With this structure, increase in emitter resistance of the HBT is prevented for the semiconductor device according to the present invention. Furthermore, in the first region, the third nitride semiconductor layer may be in contact with the emitter electrode and include a low-resistance region which includes n-type dopants at a concentration higher than a concentration of n-type dopants included in the second region of the third nitride semiconductor layer.

Furthermore, the first nitride semiconductor layer and the third nitride semiconductor layer may have p-type conductivity, the second nitride semiconductor layer may include: a fourth nitride semiconductor layer formed on the first nitride semiconductor layer; and a fifth nitride semiconductor layer formed on the fourth nitride semiconductor layer, the fifth nitride semiconductor layer having a wider band gap than the fourth nitride semiconductor layer, the source electrode and the drain electrode may be electrically connected to the second nitride semiconductor layer in the second region, and the gate electrode may be formed on the fifth nitride semiconductor layer in the second region.

With this structure, the FET of the semiconductor device according to the present invention is formed using the nitride semiconductor layer which also forms the base layer of the HBT. Only the emitter layer (the first nitride semiconductor layer) is thus formed on the nitride semiconductor layer which forms the FET. This reduces distortion of a wafer due to a lattice mismatch of the semiconductor device according to the present invention. In addition, because etching is necessary only for the emitter layer (the first nitride semiconductor layer) in forming the FET, etching is easily controlled for the semiconductor device according to the present invention.

Furthermore, the fourth nitride semiconductor layer may include GaN, and the fifth nitride semiconductor layer may include AlGaN.

Furthermore, the second nitride semiconductor layer may have a thickness of 50 nm or less. With this structure, increase in emitter resistance is prevented for the semiconductor device according to the present invention.

Furthermore, the third nitride semiconductor layer may include $Al_yGa_{1-y}N$, where $0 \leq y \leq 1$.

Furthermore, the semiconductor device may further include a backgate electrode of the field-effect transistor, the backgate electrode being electrically connected to the first nitride semiconductor layer in the second region.

With this structure, biasing the backgate electrode reduces leak current flowing between the source electrode and the drain electrode when the FET is off. In addition, when the FET is on, adequately biasing the backgate electrode allows changing a threshold voltage of the FET as necessary.

Furthermore, the first nitride semiconductor layer may include: a low-concentration region in contact with the second nitride semiconductor layer and not in contact with the collector electrode; and a high-concentration region in contact with the collector electrode, the high-concentration region including dopants at a higher concentration than the low-concentration region.

Furthermore, the third nitride semiconductor layer may include: a sixth nitride semiconductor layer formed on the second nitride semiconductor layer; and a seventh nitride semiconductor layer formed on the sixth nitride semiconductor layer, the seventh nitride semiconductor layer having a narrower bandgap than the sixth nitride semiconductor layer.

With this structure, contact resistance of the emitter electrode of the HBT is reduced for the semiconductor device according to the present invention.

Furthermore, the gate electrode may be formed on the third nitride semiconductor layer in the second region.

With this structure, an enhancement-mode FET is easily formed. Furthermore, the semiconductor device may include field-effect transistors including the field-effect transistor, wherein the field-effect transistors include a depletion-mode field-effect transistor and an enhancement-mode field-effect transistor.

Furthermore, the nitride semiconductor layer may include: a first nitride semiconductor layer formed above the substrate; a second nitride semiconductor layer formed on the first nitride semiconductor layer; and a third nitride semiconductor layer formed on the second nitride semiconductor layer, and the semiconductor device may further include: an isolation region which separates each of the first nitride semiconductor layer, the second nitride semiconductor layer, and the third nitride semiconductor layer into a first region in which the heterojunction bipolar transistor is formed, a second region in which the depletion-mode field-effect transistor is formed, and a third region in which the enhancement-mode field-effect transistor is formed, the first region, the second region, and the third region being electrically isolated from one another; a collector electrode of the heterojunction bipolar transistor, the collector electrode being electrically connected to the first nitride semiconductor layer in the first region; a base electrode of the heterojunction bipolar transistor, the base electrode being electrically connected to the second nitride semiconductor layer in the first region; an emitter electrode of the heterojunction bipolar transistor, the emitter electrode being electrically connected to the third nitride semiconductor layer in the first region; a source electrode and a drain electrode of the depletion-mode field-effect transistor, the source electrode and the drain electrode being electrically connected to the second nitride semiconductor layer in the second region; a gate electrode of the depletion-mode field-effect transistor, the gate electrode being formed on the second nitride semiconductor layer in the second region; a source electrode and a drain electrode of the enhancement-mode field-effect transistor, the source electrode and the drain electrode being electrically connected to the second nitride semiconductor layer in the third region; and a gate electrode of the enhancement-mode field-effect transistor, the gate electrode being formed on the third nitride semiconductor layer in the third region.

With this structure, an enhancement-mode FET and a depletion-mode FET are easily formed.

The present invention may be implemented as a manufacturing method of the semiconductor devices as described above.

The present invention thus provides a semiconductor device which includes an HBT and an FET and operates at high voltages and high temperatures.

FURTHER INFORMATION ABOUT TECHNICAL BACKGROUND TO THIS APPLICATION

The disclosure of Japanese Patent Application No. 2009-051181 filed on Mar. 4, 2009 including specification, drawings and claims are incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

Embodiments of the present invention will be described below with reference to drawings.

Embodiment 1

In a semiconductor device according to Embodiment 1, an HBT and an HFET are formed using nitride semiconductor layers.

Here, in order to overcome limitations of materials of GaAs elements, use of wide bandgap semiconductors is effective. Nitride semiconductors are favorable among the wide bandgap semiconductors because of their excellent physical properties such as a wide bandgap, high breakdown electric field, and high electron saturation velocity.

Furthermore, bandgaps of the nitride semiconductors may be changed as needed by changing a crystal mixing ratio. For example, in AlGaN/GaN heterostructure in which a nitride semiconductor layer of AlGaN and a nitride semiconductor layer of GaN, which have different bandgaps from each other, are joined together, spontaneous polarization and piezoelectric polarization are caused on a (0001) plane, thereby generating electric charges at a heterointerface therebetween. Thus, in the AlGaN/GaN heterostructure, a sheet carrier density not lower than $1 \times 10^{13}$ cm$^{-2}$ is provided even when the nitride semiconductor layer of AlGaN are undoped. Thus, it is also possible to provide a heterojunction field effect transistor (heterojunction FET) having a channel in which the electric charges generated at the heterointerface serve as carriers.

The semiconductor device according to Embodiment 1 of the present invention thus achieves operation at higher voltages and higher temperatures.

Figure 1:
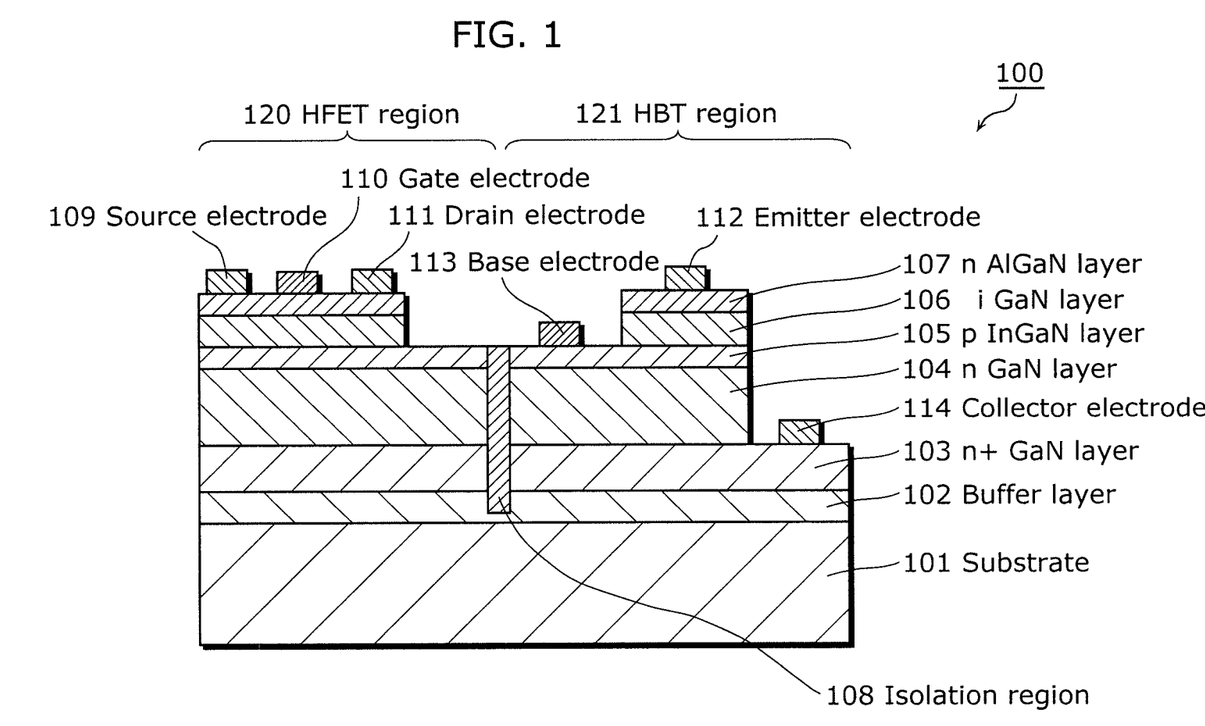
FIG. 1 is a schematic cross-sectional view which shows a structure of a semiconductor device according to Embodiment 1 of the present invention.

FIG. 1 is a cross-sectional view of a semiconductor device 100 according to Embodiment 1 of the present invention. As shown in FIG. 1, the semiconductor device 100 according to Embodiment 1 of the present invention includes an HBT and an HFET. The semiconductor device 100 includes a substrate 101 made of sapphire and the following over the substrate 101: a buffer layer 102 made of AlN having a thickness of 100 nm, an n$^+$-type GaN layer 103 having a thickness of 500 nm, an n-type GaN layer 104 having a thickness of 500 nm, a p-type InGaN layer 105 having a thickness of 100 nm, an undoped GaN layer 106 having a thickness of 30 nm, an n-type AlGaN layer 107 having a thickness of 15 nm, an isolation region 108, a source electrode 109, a gate electrode 110, a drain electrode 111, an emitter electrode 112, a base electrode 113, and a collector electrode 114.

The buffer layer 102, the n$^+$-type GaN layer 103, the n-type GaN layer 104, the p-type InGaN layer 105, the undoped GaN layer 106, the n-type AlGaN layer 107 are stacked in order on the substrate 101.

Here, the term undoped means that doping is intentionally avoided while crystals are grown.

The semiconductor device 100 includes an HFET region 120 in which the HFET is formed and an HBT region 121 in which the HBT is formed.

The source electrode 109 and the drain electrode 111 have a laminated structure of titanium (Ti) and aluminum (Al). The source electrode 109 and the drain electrode 111 are electrically connected to at least one of the undoped GaN layer 106 and the n-type AlGaN layer 107 in the HFET region 120. More specifically, the source electrode 109 and the drain electrode 111 are formed so that at least part of each of them contacts with one of or both of the undoped GaN layer 106 and the n-type AlGaN layer 107 in the HFET region 120.

The gate electrode 110 is made of palladium (Pd) and formed in contact with a top face of the n-type AlGaN layer 107 in the HFET region 120.

The source electrode 109, the drain electrode 111, and the gate electrode 110 are a source electrode, a gate electrode, and a drain electrode of the HFET, respectively.

The emitter electrode 112 has a laminated structure of titanium (Ti) and aluminum (Al). The emitter electrode 112 is electrically connected to at least one of the undoped GaN layer 106 and the n-type AlGaN layer 107 in the HBT region 121. More specifically, the emitter electrode 112 is formed so that at least part of the emitter electrode 112 contacts with one of or both of the undoped GaN layer 106 and the n-type AlGaN layer 107 in the HBT region 121.

The base electrode 113 is made of palladium (Pd) and electrically connected to the p-type InGaN layer 105. More specifically, the base electrode 113 is formed in contact with a top face of the p-type InGaN layer 105 in the HBT region 121.

The collector electrode 114 has a laminated structure of titanium (Ti) and aluminum (Al). The collector electrode 114 is electrically connected to at least one of the n$^+$-type GaN layer 103 and the n-type GaN layer 104 in the HBT region 121. More specifically, the collector electrode 114 is formed in contact with a top face of the n$^+$-type GaN layer 103 in the HBT region 121.

The emitter electrode 112, the base electrode 113, and the collector electrode 114 are an emitter electrode, a base electrode, and a collector electrode of the HBT, respectively.

The isolation region 108 is provided with high resistance by ion-implanting boron (B) thereinto. The isolation region 108 electrically isolates the HFET region 120 and the HBT region 121. More specifically, the isolation region 108 separates each of the nitride semiconductor layers including the n$^+$-type GaN layer 103, the n-type GaN layer 104, and the p-type InGaN layer 105 into the HFET region 120 and the HBT region 121 which are electrically isolated from each other.

The n$^+$-type GaN layer 103 and the n-type GaN layer 104 correspond to a first nitride semiconductor layer of the present invention. The n$^+$-type GaN layer 103 and the n-type GaN layer 104 in the HBT region 121 are a collector layer of the HBT. The n$^+$-type GaN layer 103 in the HBT region 121 corresponds to a high-concentration region of the present invention. The n-type GaN layer 104 corresponds to a low-concentration region of the present invention.

The p-type InGaN layer 105 corresponds to a second nitride semiconductor layer of the present invention. The p-type InGaN layer 105 in the HBT region 121 is a base layer of the HBT.

The undoped GaN layer 106 and the n-type AlGaN layer 107 correspond to a third nitride semiconductor layer of the present invention. The undoped GaN layer 106 and the n-type AlGaN layer 107 correspond to a fourth nitride semiconductor layer and a fifth nitride semiconductor layer, respectively.

The undoped GaN layer 106 and the n-type AlGaN layer 107 in the HBT region 121 are an emitter layer of the HBT. The undoped GaN layer 106 in the HFET region 120 is a channel layer of the HFET. The n-type AlGaN layer 107 in the HFET region 120 is a donor layer of the HFET.

In a semiconductor device 100 according to Embodiment 1, the HBT and the HFET are formed using the nitride semiconductor layers as describe above. The semiconductor device 100 thus achieves operation at higher voltages and higher temperatures.

In the semiconductor device 100 with the structure described above, the source electrode 109 and the drain electrode 111 of the HFET and the emitter electrode 112 of the HBT are electrically connected to channels which are present at heterojunction interfaces between the n-type AlGaN layer 107 and the undoped GaN layer 106. In other words, the donor layer and the channel layer of the HFET are formed using the layers which also form the emitter layer of the HBT.

Figure 8:
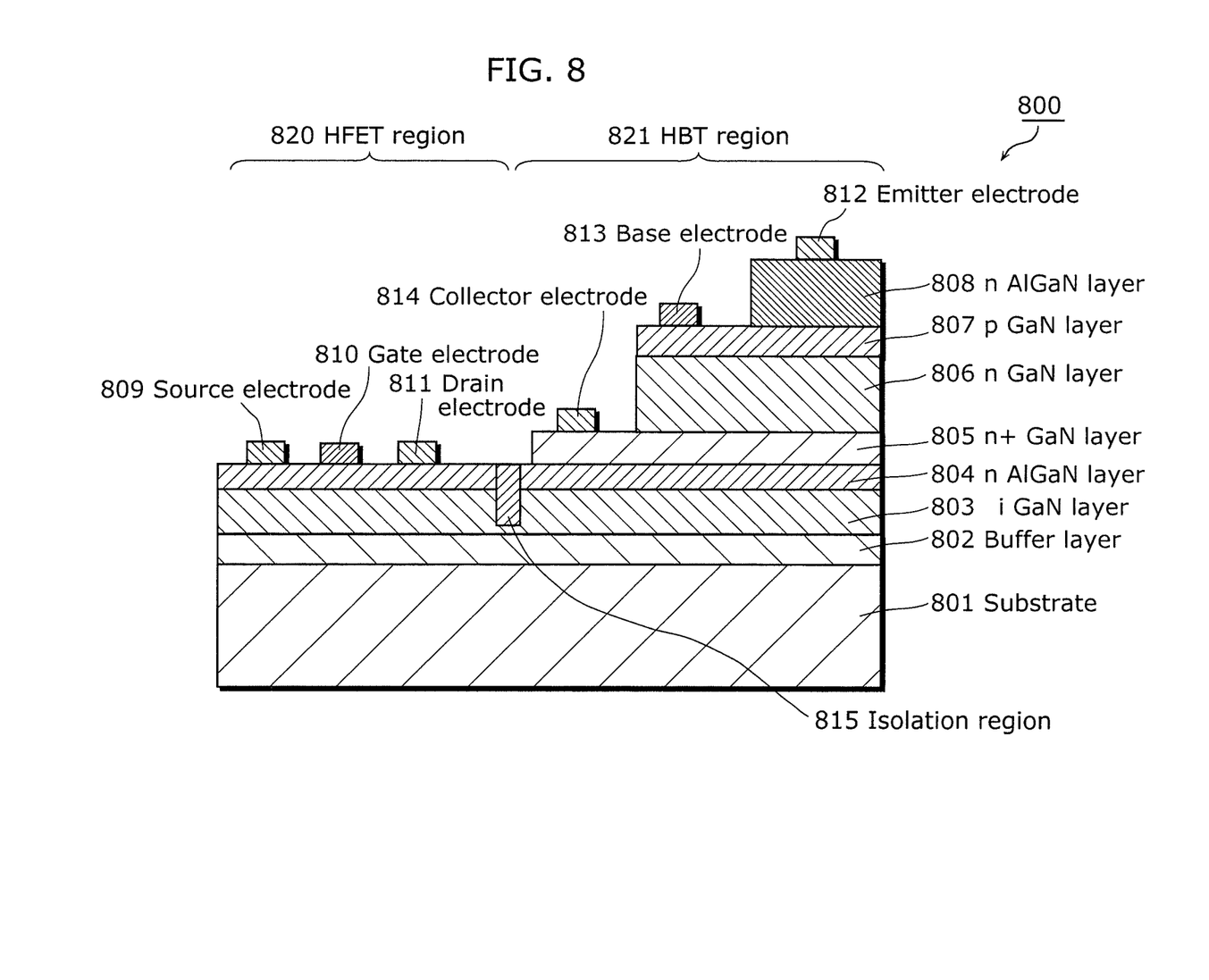
FIG. 8 is a schematic cross-sectional view which shows a structure of a comparative example of a semiconductor device according to the present invention.

For comparison, FIG. 8 shows a structure of a semiconductor device in which a conventional BiFET structure is applied to nitride semiconductors. In a semiconductor device 800, as shown in FIG. 8, a buffer layer 802 made of aluminum nitride (AlN), an undoped GaN layer 803, an n-type AlGaN layer 804, an n$^+$-type GaN layer 805, an n-type GaN layer 806, a p-type GaN layer 807, and an n-type AlGaN layer 808 are stacked in order on a substrate 801 made of sapphire.

A source electrode 809, a gate electrode 810, and a drain electrode 811 are formed on the n-type AlGaN layer 804 in an HFET region 820. The source electrode 809, the gate electrode 810, and a drain electrode 811 forms an HFET.

In an HBT region 821, an emitter electrode 812 is formed on the n-type AlGaN layer 808, a base electrode 813 on the p-type GaN layer 807, and a collector electrode 814 on the n$^+$-type GaN layer 805. The emitter electrode 812, the base electrode 813, and the collector electrode 814 forms an HBT.

Here, a structure is also possible in which the collector electrode 814 is formed on the n-type AlGaN layer 804 without the n$^+$-type GaN layer 805 therebetween.

The isolation region 815 electrically isolates the HFET region 820 and the HBT region 821.

The n$^+$-type GaN layer 805, the n-type GaN layer 806, the p-type GaN layer 807, and the n-type AlGaN layer 808, which form the HBT, are thus formed on the n-type AlGaN layer 804 which serves as a donor layer of the HFET. In practice, however, a wafer may crack with a high probability due to large distortion of a wafer. Furthermore, in order to form the HFET, it is necessary to remove the semiconductor layers which form the HBT to expose the n-type AlGaN layer 804. However, it is very difficult to remove only the semiconductor layers which form the HBT having a thickness of 1 µm or more by dry etching and then stop the dry etching at a surface of the n-type AlGaN layer 804 having a thickness of tens of nanometers in a nitride semiconductor which lacks an adequate etch-stop layer.

On the other hand, in a structure of the semiconductor device 100 according to Embodiment 1, the n-type AlGaN layer 107 and the undoped GaN layer 106, which have a large lattice mismatch therebetween, are top layers, and no more semiconductor layer is stacked thereon. This structure reduces distortion of a wafer due to the lattice mismatch, allowing epitaxial growth of the nitride semiconductor layers without causing a crack.

Furthermore, as the nitride semiconductor layers which form the HFET are top layers, there is no need for removing a semiconductor layer on the n-type AlGaN layer 107 and the undoped GaN layer 106 by dry etching in forming the HFET. In other words, there is no need for stopping etching at a surface of the n-type AlGaN layer 107 having a thickness of 15 nm. Thus, dry etching is easily controlled for the semiconductor device 100. Bi-FETs including nitride semiconductors are thereby manufactured with good reproducibility.

Here, because trap levels are densely present on the surface of the n-type AlGaN layer 107, carriers are trapped in the trap levels when the HFET is switched. This causes decrease in drain current or, what is called, current collapse. Dry-etching of the surface of the n-type AlGaN layer 107 increases the number of the trap levels, and thus making the current collapse severer. However, in Embodiment 1 of the present invention, a Bi-FET is manufactured without deteriorating electrical properties of the HFET because the surface of the n-type AlGaN layer 107 in an active region of the HFET is not dry-etched.

The following is an exemplary manufacturing method of the semiconductor device 100 structured as described above. For example, the buffer layer 102 made of AlN and having a thickness of 100 nm, the Si-doped n$^+$-type GaN layer 103 having a thickness of 500 nm, the Si-doped n-type GaN layer 104 having a thickness of 500 nm, the Mg-doped p-type InGaN layer 105 having a thickness of 100 nm, the undoped GaN layer 106 having a thickness of 30 nm, the Si-doped n-type AlGaN layer 107 having a thickness of 15 nm are epitaxially grown in order on the substrate 101 made of sapphire, using a metal organic chemical vapor deposition (MOCVD) method.

The thicknesses of these layers are not limited to them, but it is preferable that a total thickness of the undoped GaN layer 106 and the n-type AlGaN layer 107 is 50 nm or less for the purpose of preventing increase in emitter resistance of the HBT.

The substrate 101 is not limited to the substrate made of sapphire. It may be a substrate made of a material such as Si, SiC, or GaN. Dopants which make the layers n type are not limited to Si. Dopants which make the layer p type are not limited to Mg. An In composition ratio of the p-type InGaN 105 may be $In_xGa_{1-x}N$ ($0 \leq x \leq 1$). In other words, the layer may be a p-type GaN layer. The undoped GaN layer 106 is not necessarily undoped one but may be replaced by an n-type GaN layer. The n-type AlGaN layer 107 may be replaced by an undoped AlGaN layer. This is because spontaneous polarization and piezoelectric polarization are caused on a (0001) plane also in an undoped AlGaN/GaN heterostructure, thereby generating electric charges at a heterointerface therebetween to provide a sheet carrier density not lower than $1\times10^{13}$ cm$^{-2}$. The Al composition ratio of the n-type AlGaN layer 107 is not limited. It may be, for example, $Al_{0.25}$GaN.

Next, a mask is selectively formed on a top surface, and then part of the p-type InGaN layer 105 is exposed using, for example, a dry-etching method. Next, another mask is selectively formed, and then part of the n$^+$-type GaN layer 103 is exposed using the same method.

Next, the isolation region 108 is formed by ion-implanting, for example, B. Subsequently, the source electrode 109, the drain electrode 111, and the emitter electrode 112 made of, for example, Ti and Al are formed on the n-type AlGaN layer 107 by an electron-beam evaporation method and a lift-off method followed by an ohmic sintering thermal treatment. The collector electrode 114 made of, for example, Ti and Al is formed on the n$^+$-type GaN layer 103 in the same manner. Here, the source electrode 109, the drain electrode 111, and the emitter electrode 112 may be formed after removing all or part of the n-type AlGaN layer 107 using, for example, a dry-etching method.

Next, the gate electrode 110 made of, for example, Pd is formed on the n-type AlGaN layer 107 using, for example, an electron-beam evaporation method and a lift-off method. The base electrode 113 made of, for example, Pd is formed on the p-type InGaN layer 105 in the same manner.

This is a manufacturing process of the semiconductor device 100 shown in FIG. 1. The structure shown in FIG. 1 may be modified as described below.

Figure 2:
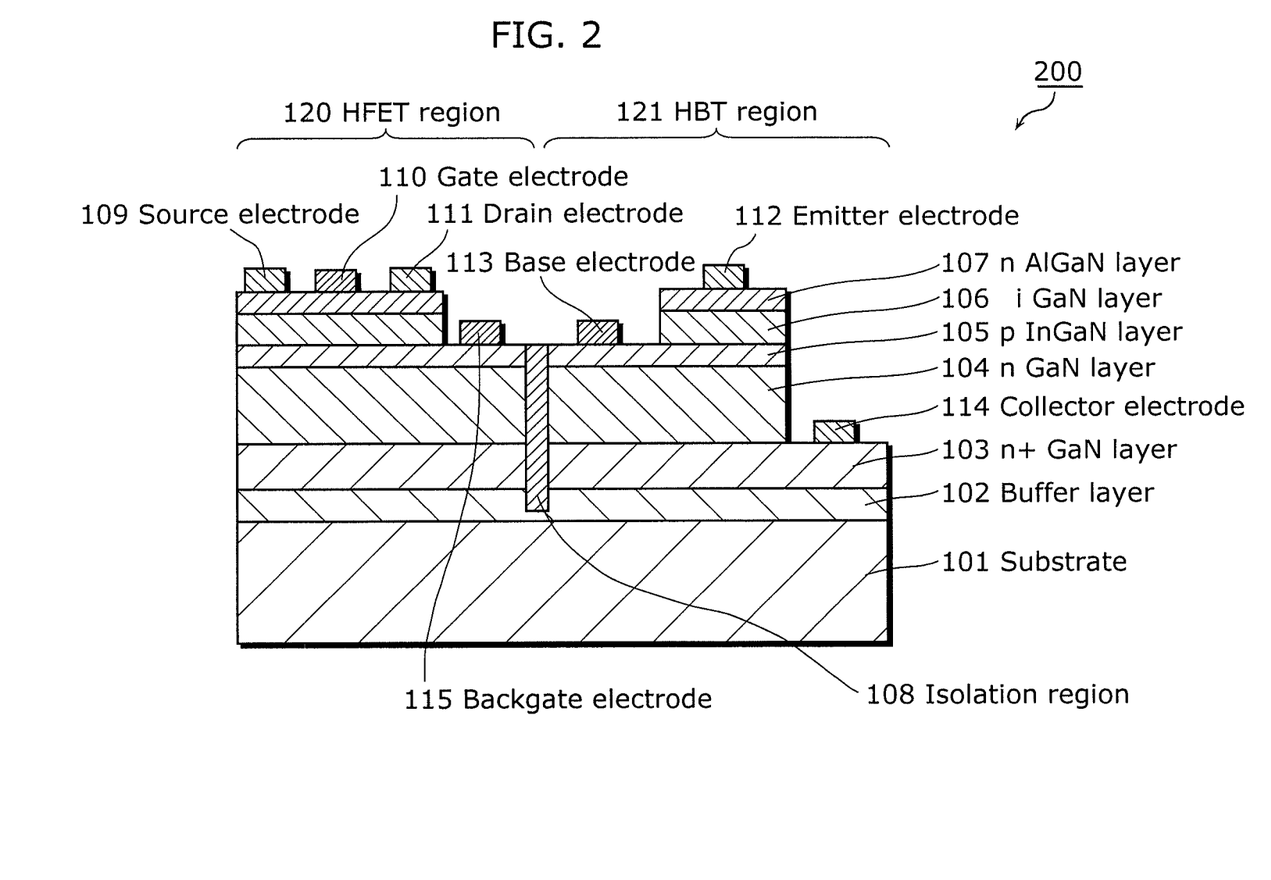
FIG. 2 is a schematic cross-sectional view which shows a structure of a semiconductor device according to Modification 1 of Embodiment 1 of the present invention.
Figure 3:
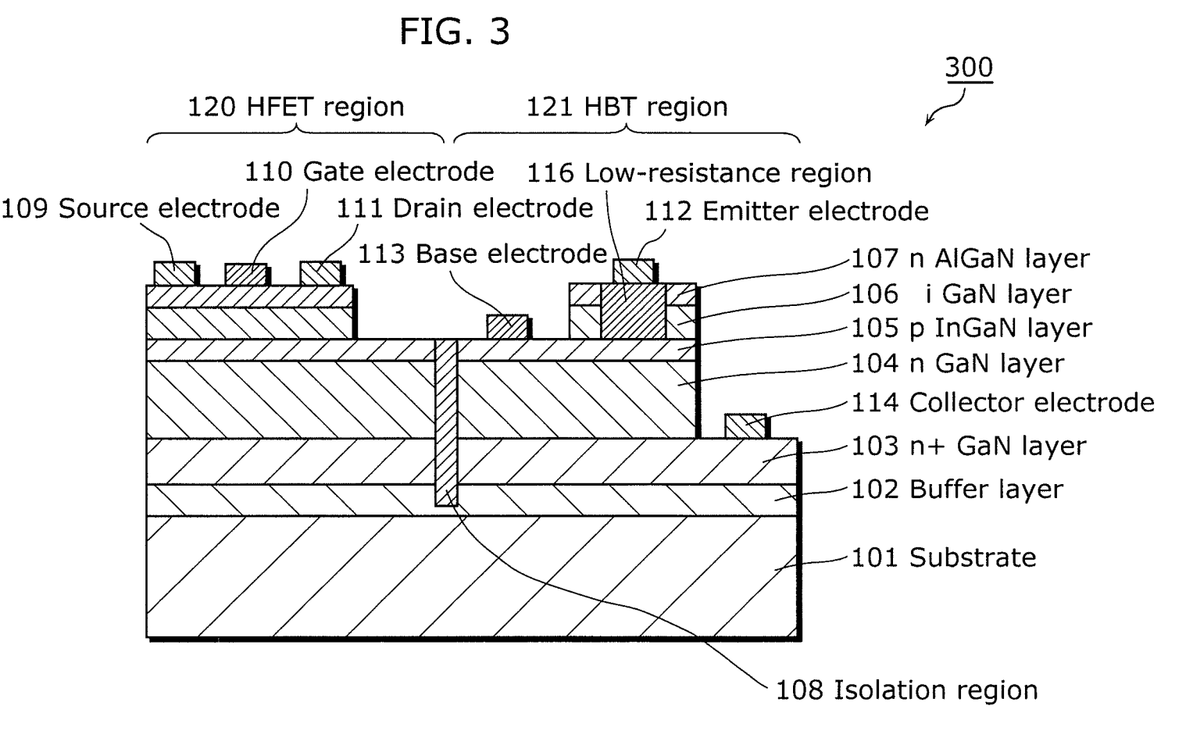
FIG. 3 is a schematic cross-sectional view which shows a structure of a semiconductor device according to Modification 2 of Embodiment 1 of the present invention.

FIG. 2 and FIG. 3 are cross-sectional views of semiconductor devices 200 and 300, respectively, which are modifications of the semiconductor device 100 according to Embodiment 1 of the present invention.

A backgate electrode 115 made of, for example, Pd may be formed on the p-type InGaN layer 105 in the HFET region 120 as shown in FIG. 2.

Biasing the backgate electrode 115 reduces leak current flowing between the source electrode 109 and the drain electrode 111 when the HFET is off. In addition, when the HFET is on, adequately biasing the backgate electrode 115 allows changing a threshold voltage of the HFET as necessary. These techniques may be utilized for manufacturing a Bi-FET in which a plurality of HFETs including a depletion-mode HFET (hereinafter referred to as DFET) and an enhancement-mode HFET (hereinafter referred to as an EFET) is formed.

Although not shown, there is another manufacturing method of an EFET in which first the n-type AlGaN layer 107 below the gate electrode 110 is partly removed to provide a recess therein, and then the gate electrode 110 is formed thereon. A Bi-FET including a DFET and an EFET is manufactured by selectively forming a recess below the gate electrode 110 of each HFET therein.

In Modification 2 of Embodiment 1, a low-resistance region 116 may be formed in at least part of the n-type AlGaN layer 107 and the undoped GaN layer 106 positioned below the emitter electrode 112 of the HBT as shown in FIG. 3. The low-resistance region 116 is formed by ion-implanting n-type dopants such as silicon (Si). It is also possible to form the low-resistance region 116 by first removing the n-type AlGaN layer 107 and then ion-implanting n-type dopants into part of the undoped GaN layer 106. The emitter electrode 112 is then formed on the formed low-resistance region 116. This further reduces the emitter resistance of the HBT.

Embodiment 2

In a semiconductor device according to Embodiment 2, an HFET is formed using a nitride semiconductor layer which also forms a base layer of an HBT. A layer provided above the nitride semiconductor layer which forms the HFET is only an emitter layer. This reduces distortion of a wafer due to a lattice mismatch and allows easy control of etching for the semiconductor device according to Embodiment 2 of the present invention.

Figure 4:
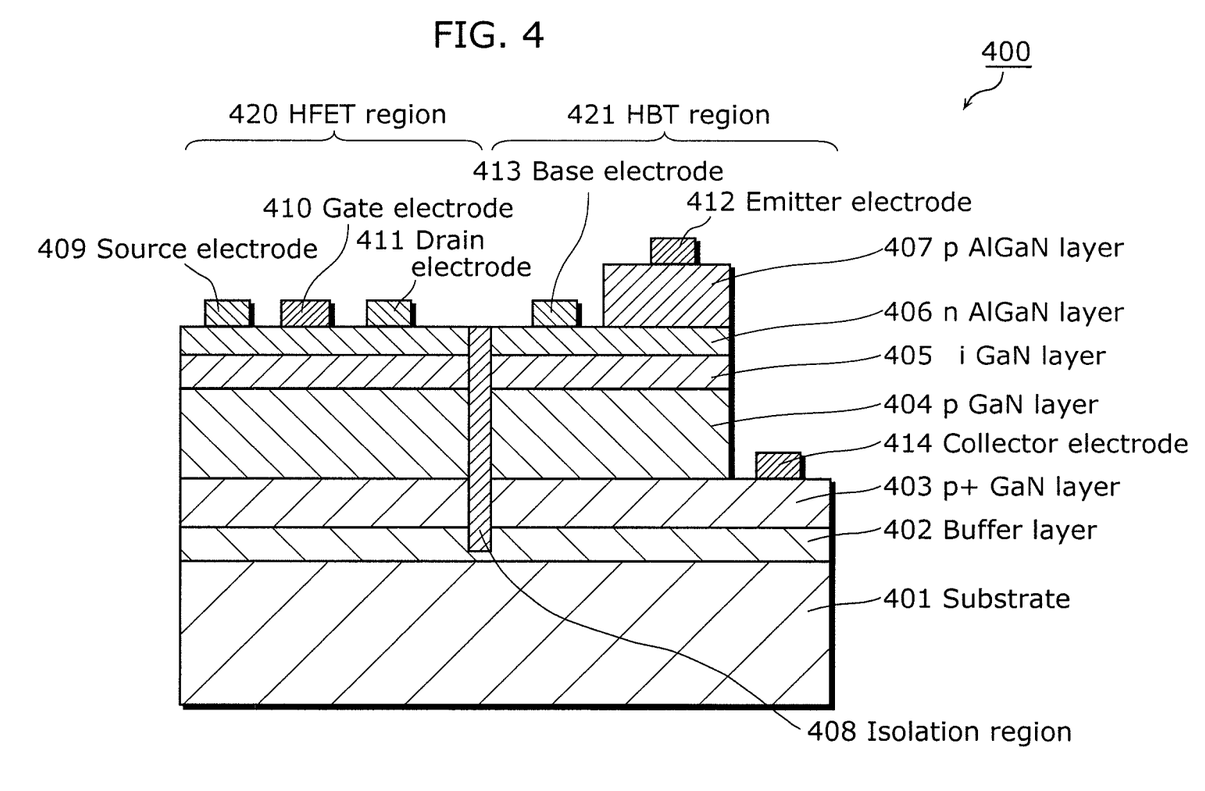
FIG. 4 is a schematic cross-sectional view which shows a structure of a semiconductor device according to Embodiment 2 of the present invention.

FIG. 4 is a cross-sectional view of a semiconductor device 400 according to Embodiment 2 of the present invention. The semiconductor device 400 shown in FIG. 4 includes an HBT and an HFET. The semiconductor device 400 includes a substrate 401 made of sapphire and the following over the substrate 401: a buffer layer 402 made of AlN having a thickness of 100 nm, a p$^+$-type GaN layer 403 having a thickness of 500 nm, a p-type GaN layer 404 having a thickness of 500 nm, an undoped GaN layer 405 having a thickness of 30 nm, an n-type AlGaN layer 406 having a thickness of 15 nm, a p-type AlGaN layer 407 having a thickness of 200 nm, an isolation region 408, a source electrode 409, a gate electrode 410, a drain electrode 411, an emitter electrode 412, a base electrode 413, and a collector electrode 414.

The buffer layer 402, the p$^+$-type GaN layer 403, the p-type GaN layer 404, the undoped GaN layer 405, the n-type AlGaN layer 406, the p-type AlGaN layer 407 are stacked in order on the substrate 401.

Here, the term undoped means that doping is intentionally avoided while crystals are grown.

The semiconductor device 400 includes an HFET region 420 in which the HFET is formed and an HBT region 421 in which the HBT is formed.

The source electrode 409 and the drain electrode 411 have a laminated structure of Ti and Al. The source electrode 409 and the drain electrode 411 are electrically connected to at least one of the undoped GaN layer 405 and the n-type AlGaN layer 406 in the HFET region 420. More specifically, the source electrode 409 and the drain electrode 411 are formed so that at least part of each of them contacts with one of or both of the undoped GaN layer 405 and the n-type AlGaN layer 406 in the HFET region 420.

The gate electrode 410 is made of Pd and formed in contact with a top face of the n-type AlGaN layer 406 in the HFET region 420.

The source electrode 409, the drain electrode 411, and the gate electrode 410 are a source electrode, a gate electrode, and a drain electrode of the HFET, respectively.

The emitter electrode 412 is made of Pd and electrically connected to the p-type AlGaN layer 407 in the HBT region 421. More specifically, the emitter electrode 412 is formed in contact with a top face of the p-type AlGaN layer 407 in the HBT region 421.

The base electrode 413 has a laminated structure of Ti and Al. The base electrode 413 is electrically connected to at least one of the undoped GaN layer 405 and the n-type AlGaN layer 406 in the HBT region 421. More specifically, the base electrode 413 is formed so that at least part of the base electrode 413 contacts with one of or both of the undoped GaN layer 405 and the n-type AlGaN layer 406 in the HBT region 421.

The collector electrode 414 is made of Pd and electrically connected to at least one of the p$^+$-type GaN layer 403 and the p-type GaN layer 404 in the HBT region 421. More specifically, the collector electrode 414 is formed in contact with a top face of the $p^+$-type GaN layer 403 in the HBT region 421.

The emitter electrode 412, the base electrode 413, and the collector electrode 414 are an emitter electrode, a base electrode, and a collector electrode of the HBT, respectively.

The isolation region 408 is provided with high resistance by ion-implanting B thereinto. The isolation region 408 electrically isolates the HFET region 420 and the HBT region 421. More specifically, the isolation region 408 separates each of the nitride semiconductor layers including the $p^+$-type GaN layer 403, the p-type GaN layer 404, the undoped GaN layer 405, and the n-type AlGaN layer 406 into the HFET region 420 and the HBT region 421 which are electrically isolated from each other.

The $p^+$-type GaN layer 403 and the p-type GaN layer 404 correspond to the first nitride semiconductor layer of the present invention. The $p^+$-type GaN layer 403 and the p-type GaN layer 404 in the HBT region 421 are a collector layer of the HBT. The $p^+$-type GaN layer 403 in the HBT region 421 corresponds to the high-concentration region of the present invention. The p-type GaN layer 404 corresponds to the low-concentration region of the present invention.

The undoped GaN layer 405 and the n-type AlGaN layer 406 correspond to the second nitride semiconductor layer of the present invention. The undoped GaN layer 405 and the n-type AlGaN layer 406 correspond to the fourth nitride semiconductor layer and the fifth nitride semiconductor layer, respectively.

The undoped GaN layer 405 and the n-type AlGaN layer 406 in the HBT region 421 are a base layer of the HBT. The undoped GaN layer 405 in the HFET region 420 is a channel layer of the HFET. The n-type AlGaN layer 406 in the HFET region 420 is a donor layer of the HFET.

The p-type AlGaN layer 407 corresponds to the third nitride semiconductor layer of the present invention. The p-type AlGaN layer 407 in the HBT region 421 is an emitter layer of the HBT.

In the semiconductor device 400 with the structure described above, the source electrode 409 and the drain electrode 411 of the HFET, and the base electrode 413 of the HBT are formed so as to be electrically connected to channels which are present at heterojunction interfaces between the n-type AlGaN layer 406 and the undoped GaN layer 405. In other words, the donor layer and the channel layer of the HFET are formed using the layers which also form the base layer of the HBT. In this structure, only the p-type AlGaN layer 407 is present over the n-type AlGaN layer 406 and the undoped GaN layer 405, between which a lattice mismatch is large. This structure allows epitaxial growth of the nitride semiconductor layers without causing a crack.

The p-type AlGaN layer 407 has a thickness of 200 nm. Although the p-type AlGaN layer 407 needs to be removed in order to form the HFET, the p-type AlGaN layer 407 is thin enough to allow stopping etching at the top face of the n-type AlGaN layer 406 with ease. Bi-FETs including nitride semiconductors are thereby manufactured with good reproducibility.

The following is an exemplary manufacturing method of the semiconductor device 400 structured as described above. For example, the buffer layer 402 made of AlN and having a thickness of 100 nm, the Mg-doped $p^+$-type GaN layer 403 having a thickness of 500 nm, the Mg-doped p-type GaN layer 404 having a thickness of 500 nm, the undoped GaN layer 405 having a thickness of 30 nm, the Si-doped n-type AlGaN layer 406 having a thickness of 15 nm, the Mg-doped p-type AlGaN layer 407 having a thickness of 200 nm are epitaxially grown in order on the substrate 401 made of sapphire, using an MOCVD method.

The thicknesses of these layers are not limited to them, but it is preferable that a total thickness of the undoped GaN layer 405 and the n-type AlGaN layer 406 is 50 nm or less for the purpose of preventing increase in base resistance of the HBT.

The substrate 401 is not limited to the substrate made of sapphire. It may be a substrate made of a material such as Si, SiC, or GaN. Dopants which make the layer n type are not limited to Si. Dopants which make the layers p type are not limited to Mg. The $p^+$-type GaN layer 403 may be replaced by a p-type GaN layer. The undoped GaN layer 405 is not necessarily undoped but may be replaced by an n-type GaN layer. The n-type AlGaN layer 406 may be replaced by an undoped AlGaN layer. The Al composition ratio of the n-type AlGaN layer 406 is not limited. It may be, for example, $Al_{0.25}GaN$. An Al composition ratio of the p-type AlGaN layer 407 may be $Al_yGa_{1-y}N$ ($0 \leq y \leq 1$). In other words, the layer may be a p-type GaN layer. Al composition ratios of the n-type AlGaN layer 406 and the p-type AlGaN layer 407 may be graded in a thickness direction of the layers.

It is also possible to form the emitter electrode 412 on a p-type GaN layer which has a smaller bandgap than the p-type AlGaN layer 407 and is stacked on the p-type AlGaN layer 407. This reduces contact resistance of the emitter electrode 412. In this structure, the p-type AlGaN layer 407 and the p-type GaN layer correspond to a sixth nitride semiconductor layer and a seventh nitride semiconductor layer of the present invention, respectively.

Next, a mask is selectively formed on a top surface, and then part of the n-type AlGaN layer 406 is exposed using, for example, a dry-etching method. Next, another mask is selectively formed, and then part of the $p^+$-type GaN layer 403 is exposed using the same method.

Next, the isolation region 408 is formed by ion-implanting, for example, B. Subsequently, the source electrode 409, the drain electrode 411, and the base electrode 413 made of, for example, Ti and Al are formed on the n-type AlGaN layer 406 by an electron-beam evaporation method and a lift-off method followed by an ohmic sintering thermal treatment. Here, the source electrode 409, the drain electrode 411, and the base electrode 413 may be formed after removing all or part of the n-type AlGaN layer 406 using, for example, a dry-etching method.

Next, the gate electrode 410 made of, for example, Pd is formed on the n-type AlGaN layer 406 using, for example, an electron-beam evaporation method and a lift-off method. The emitter electrode 412 made of, for example, Pd is formed on the p-type AlGaN layer 407 in the same manner. The collector electrode 414 made of, for example, Pd is formed on the $p^+$-type GaN layer 403 in the same manner.

This is a manufacturing process of the semiconductor device 400 shown in FIG. 4. The structure shown in FIG. 4 may be modified as described below.

Figure 5:
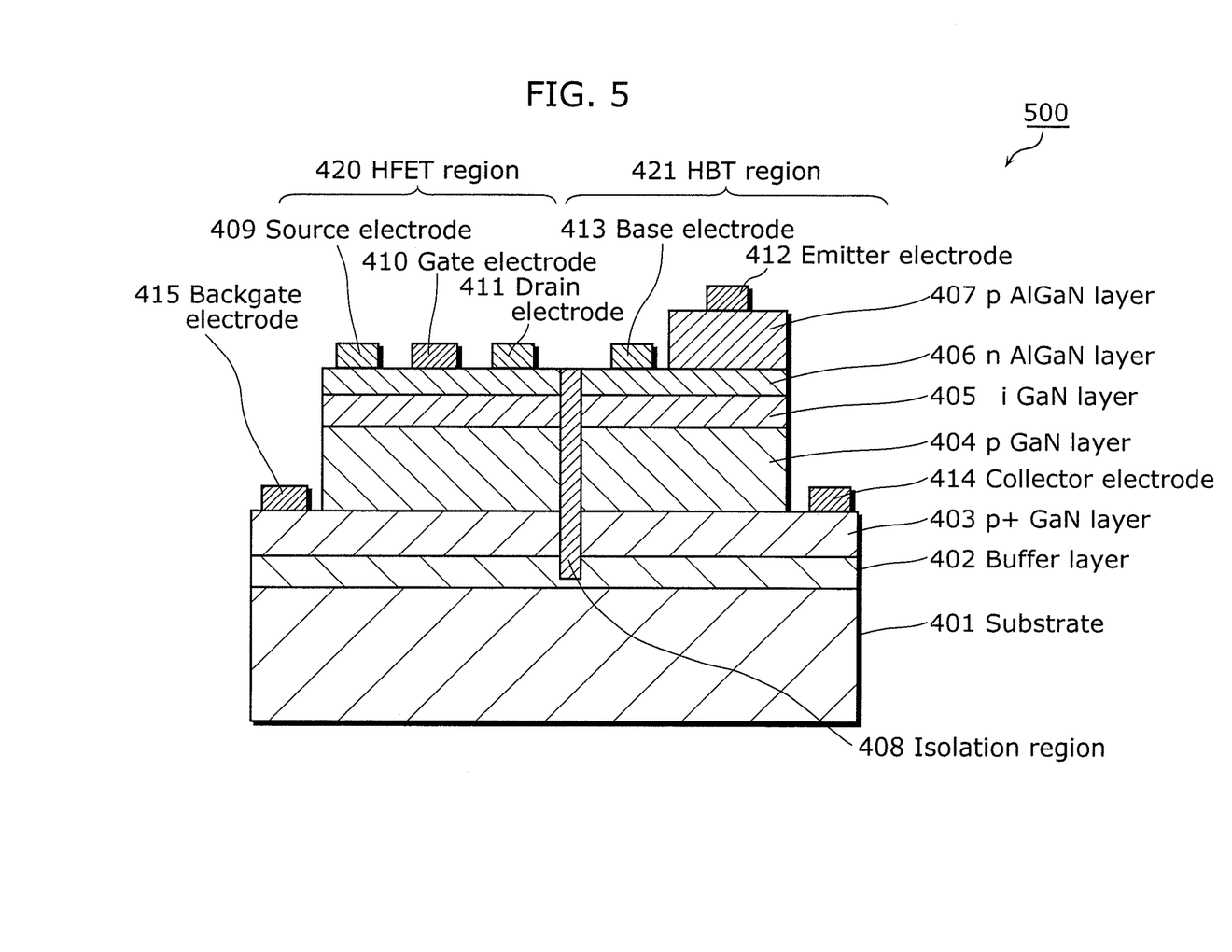
FIG. 5 is a schematic cross-sectional view which shows a structure of a semiconductor device according to Modification 1 of Embodiment 2 of the present invention.
Figure 6:
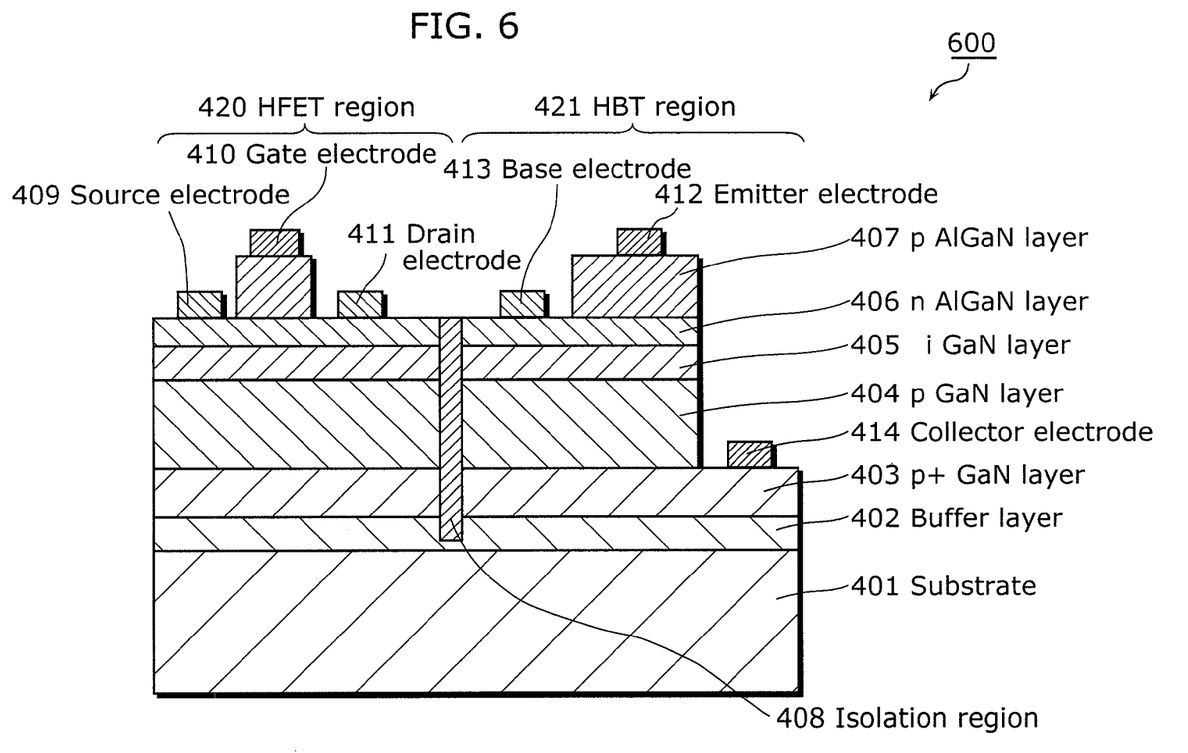
FIG. 6 is a schematic cross-sectional view which shows a structure of a semiconductor device according to Modification 2 of Embodiment 2 of the present invention.

FIG. 5 and FIG. 6 are cross-sectional views of semiconductor devices 500 and 600, respectively, which are modifications of the semiconductor device 400 according to Embodiment 2 of the present invention.

In Modification 1 of Embodiment 2, a backgate electrode 415 made of, for example, Pd may be formed on the $p^+$-type GaN layer 403 in the HFET region 420 as shown in FIG. 5. The backgate electrode 415 may be formed so that the backgate electrode 415 is electrically connected to the p-type GaN layer 404. Biasing the backgate electrode 415 reduces leak current flowing between the source electrode 409 and the drain electrode 411 when the HFET is off. In addition, when the HFET is on, adequately biasing the backgate electrode 415 allows changing a threshold voltage of the HFET as necessary.

In Modification 2 of Embodiment 2, the gate electrode 410 of the HFET may be formed on the p-type AlGaN layer 407 as shown in FIG. 6. Providing the p-type AlGaN layer 407 directly under the gate electrode 410 makes an energy position of a channel present at an interface between the n-type AlGaN layer 406 and the undoped GaN layer 405 higher than a Fermi level. As a result, a two-dimensional electron gas to be the channel is depleted only directly under the gate electrode 410. This makes a threshold voltage of the HFET equal to 0 V or higher. In other words, an EFET is provided. It is also possible to form the gate electrode 410 on a p-type GaN layer which has a smaller bandgap than the p-type AlGaN layer 407 and is stacked on the p-type AlGaN layer 407. This reduces contact resistance of the gate electrode 410.

This structure in which the p-type AlGaN layer 407 is provided directly under the gate electrode 410 is achieved by forming a mask in a region directly under the gate electrode 410 in dry-etching to form the emitter layer of the HBT. Thus, the structure shown in FIG. 6 is easily achieved without increasing process steps from process steps for achieving the structure shown in FIG. 4.

Embodiment 3

A semiconductor device according to Embodiment 3 includes an EFET, a DFET, and an HBT. The EFET and DFET are formed using a nitride semiconductor layer which forms a base layer of the HBT.

Figure 7:
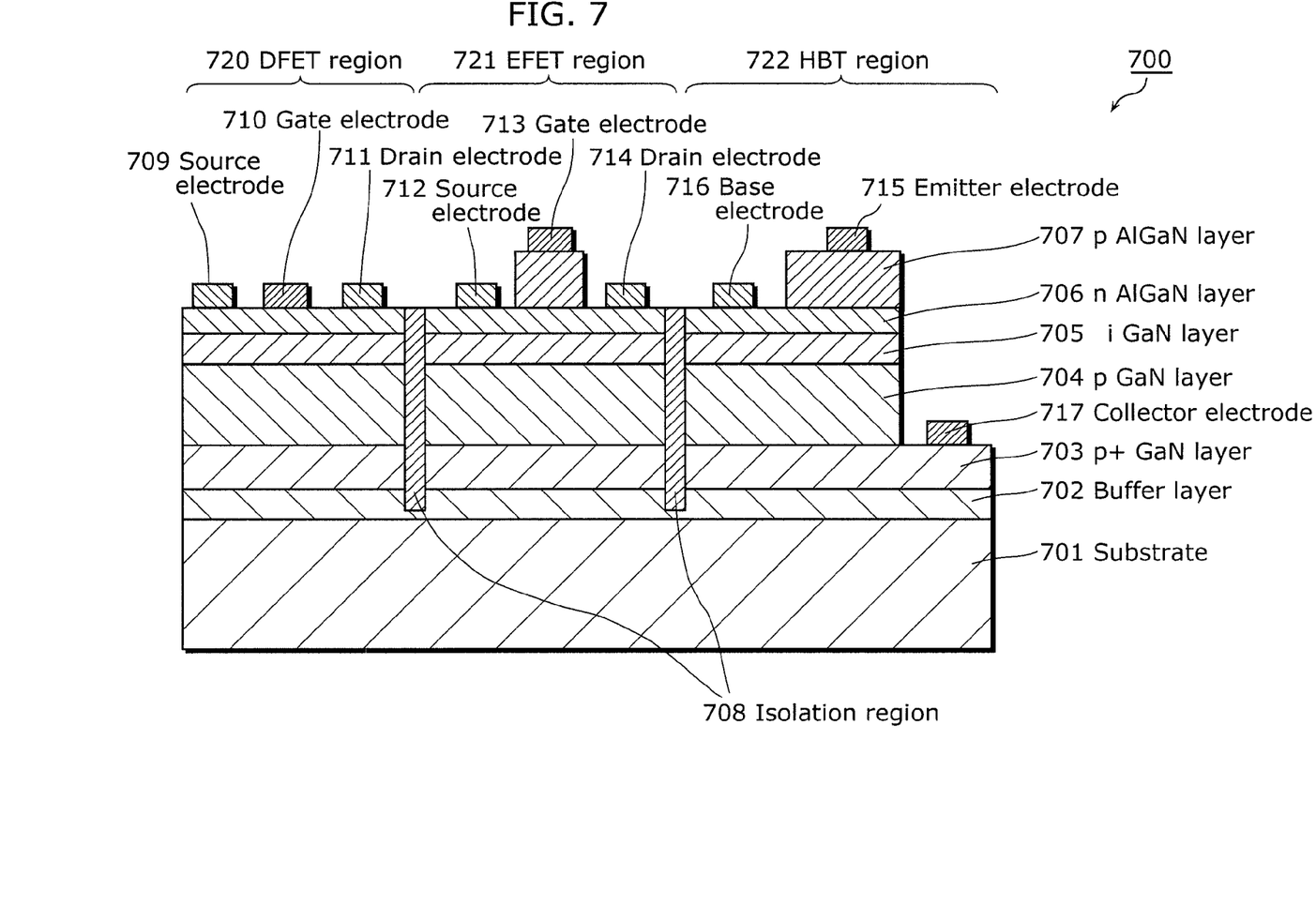
FIG. 7 is a schematic cross-sectional view which shows a structure of a semiconductor device according to Embodiment 3 of the present invention.

FIG. 7 is a cross-sectional view of a semiconductor device 700 according to Embodiment 3 of the present invention. The semiconductor device 700 shown in FIG. 7 includes a DFET, an EFET, and an HBT. The semiconductor device 700 includes a substrate 701 made of sapphire and the following over the substrate 701: a buffer layer 702 made of AlN having a thickness of 100 nm, a $p^+$-type GaN layer 703 having a thickness of 500 nm, a p-type GaN layer 704 having a thickness of 500 nm, an undoped GaN layer 705 having a thickness of 30 nm, an n-type AlGaN layer 706 having a thickness of 15 nm, a p-type AlGaN layer 707 having a thickness of 200 nm, isolation regions 708, source electrodes 709 and 712, gate electrodes 710 and 713, drain electrodes 711 and 714, an emitter electrode 715, a base electrode 716, and a collector electrode 717.

The buffer layer 702, the $p^+$-type GaN layer 703, the p-type GaN layer 704, the undoped GaN layer 705, the n-type AlGaN layer 706, the p-type AlGaN layer 707 are stacked in order on the substrate 701.

Here, the term undoped means that doping is intentionally avoided while crystals are grown.

The semiconductor device 700 includes a DFET region 720 in which the DFET is formed, an EFET region 721 in which the EFET is formed, and an HBT region 722 in which the HBT is formed.

The source electrodes 709 and 712 and the drain electrodes 711 and 714 have a laminated structure of Ti and Al. The source electrode 709 and the drain electrode 711 are electrically connected to at least one of the undoped GaN layer 705 and the n-type AlGaN layer 706 in the DFET region 720. More specifically, the source electrode 709 and the drain electrode 711 are formed so that at least part of each of them contacts with one of or both of the undoped GaN layer 705 and the n-type AlGaN layer 706 in the DFET region 720.

The source electrode 712 and the drain electrode 714 are electrically connected to at least one of the undoped GaN layer 705 and the n-type AlGaN layer 706 in the EFET region 721. More specifically, the source electrode 712 and the drain electrode 714 is formed so that at least part of each of them contacts with one of or both of the undoped GaN layer 705 and the n-type AlGaN layer 706 in the EFET region 721.

The gate electrode 710 is made of Pd and formed in contact with a top face of the n-type AlGaN layer 706 in the DFET region 720. The gate electrode 713 is also made of Pd and formed in contact with a top face of the p-type AlGaN layer 707 in the EFET region 721.

The source electrode 709, the drain electrode 710, and the gate electrode 711 are a source electrode, a gate electrode, and a drain electrode of the DFET, respectively. The source electrode 712, the drain electrode 713, and the gate electrode 714 are a source electrode, a gate electrode, and a drain electrode of the EFET, respectively.

The emitter electrode 715 is made of Pd and electrically connected to the p-type AlGaN layer 707 in the HBT region 722. More specifically, the emitter electrode 715 is formed in contact with the top face of the p-type AlGaN layer 707 in the HBT region 722.

The base electrode 716 has a laminated structure of titanium Ti and Al. The base electrode 716 is electrically connected to at least one of the undoped GaN layer 705 and the n-type AlGaN layer 706 in the HBT region 722. More specifically, the base electrode 716 is formed so that at least part of the base electrode 716 contacts with one of or both of the undoped GaN layer 705 and the n-type AlGaN layer 706 in the HBT region 722.

The collector electrode 717 is made of Pd and electrically connected to at least one of the $p^+$-type GaN layer 703 and the p-type GaN layer 704 in the HBT region 722. More specifically, the collector electrode 717 is formed in contact with a top face of the $p^+$-type GaN layer 703.

The emitter electrode 715, the base electrode 716, and the collector electrode 717 are an emitter electrode, a base electrode, and a collector electrode of the HBT, respectively.

The isolation regions 708 are provided with high resistance by ion-implanting boron B thereinto. The isolation regions 708 electrically isolate the DFET region 720, the EFET region 721, and the HBT region 722. More specifically, the isolation regions 708 separate each of the nitride semiconductor layers including the $p^+$-type GaN layer 703, the p-type GaN layer 704, the undoped GaN layer 705, and the n-type AlGaN layer 706 into the DFET region 720, the EFET region 721, and the HBT region 722 which are electrically isolated from one another.

The $p^+$-type GaN layer 703 and the p-type GaN layer 704 correspond to the first nitride semiconductor layer of the present invention. The $p^+$-type GaN layer 703 and the p-type GaN layer 704 in the HBT region 722 are a collector layer of the HBT. The $p^+$-type GaN layer 703 in the HBT region 722 corresponds to the high-concentration region of the present invention. The p-type GaN layer 704 corresponds to the low-concentration region of the present invention.

The undoped GaN layer 705 and the n-type AlGaN layer 706 correspond to the second nitride semiconductor layer of the present invention. The undoped GaN layer 705 and the n-type AlGaN layer 706 correspond to the fourth nitride semiconductor layer and the fifth nitride semiconductor layer, respectively.

The undoped GaN layer 705 and the n-type AlGaN layer 706 in the HBT region 722 are a base layer of the HBT. The undoped GaN layer 705 in the DFET region 720 and the EFET region 721 is a channel layer of the DFET and the EFET, respectively. The n-type AlGaN layer 706 in the DFET region 720 and the EFET region 721 is a donor layer of the DFET and the EFET, respectively.

The p-type AlGaN layer 707 corresponds to the third nitride semiconductor layer of the present invention. The p-type AlGaN layer 707 in the HBT region 722 is an emitter layer of the HBT.

In the semiconductor device 700 with the structure described above, the source electrode 709 and the drain electrode 711 of the DFET, the source electrode 712 and the drain electrode 714 of the EFET, and the base electrode 716 of the HBT are formed so as to be electrically connected to channels which are present at heterojunction interfaces between the n-type AlGaN layer 706 and the undoped GaN layer 705. In other words, the donor layers and the channel layers of the DFET and the EFET are formed using the layers which also form the base layer of the HBT. In this structure, only the p-type AlGaN layer 707 is present over the n-type AlGaN layer 706 and the undoped GaN layer 705, between which a lattice mismatch is large. This structure allows epitaxial growth of the nitride semiconductor layers without causing a crack.

The p-type AlGaN layer 707 has a thickness of 200 nm. Although the p-type AlGaN layer 707 needs to be removed in order to form the DFET, the p-type AlGaN layer 707 is thin enough to allow stopping etching at a top face of the n-type AlGaN layer 706 with ease.

However, in order to form the EFET, the p-type AlGaN layer 707 needs to be left present only directly under the gate electrode 713 This structure is achieved by forming a mask on a top surface of the p-type AlGaN layer 707 positioned under the gate electrode 713 in dry-etching the p-type AlGaN layer 707. In other words, Bi-FETs for which nitride semiconductors including a DFET and an EFET are used are manufactured with good reproducibility without increasing process steps from process steps for the case where only a DFET is included.

The following is an exemplary manufacturing method of the semiconductor device 700 structured as described above. For example, the buffer layer 702 made of AlN and having a thickness of 100 nm, the Mg-doped p$^+$-type GaN layer 703 having a thickness of 500 nm, the Mg-doped p-type GaN layer 704 having a thickness of 500 nm, the undoped GaN layer 705 having a thickness of 30 nm, the Si-doped n-type AlGaN layer 706 having a thickness of 15 nm, the Mg-doped p-type AlGaN layer 707 having a thickness of 200 nm are epitaxially grown in order on the substrate 701 made of sapphire, using an MOCVD method.

The thicknesses of these layers are not limited to them, but it is preferable that a total thickness of the undoped GaN layer 705 and the n-type AlGaN layer 706 is 50 nm or less for the purpose of preventing increase in base resistance of the HBT.

The substrate 701 is not limited to the substrate made of sapphire. It may be a substrate made of a material such as Si, SiC, or GaN. Dopants which make the layer n type are not limited to Si. Dopants which make the layers p type are not limited to Mg. The p$^+$-type GaN layer 703 may be replaced by a p-type GaN layer. The undoped GaN layer 705 is not necessarily undoped but may be replaced by an n-type GaN layer. The n-type AlGaN layer 706 may be replaced by an undoped AlGaN layer. The Al composition ratio of the n-type AlGaN layer 706 is not limited. It may be, for example, $Al_{0.25}GaN$. An Al composition ratio of the p-type AlGaN layer 707 may be $Al_yGa_{1-y}N$ ($0 \leq y \leq 1$). In other words, the layer may be a p-type GaN layer. Al composition ratios of the n-type AlGaN layer 406 and the p-type AlGaN layer 407 may be graded in a thickness direction of the layers.

It is also possible to form the emitter electrode 715 on a p-type GaN layer which has a smaller bandgap than the p-type AlGaN layer 707 and is stacked on the p-type AlGaN layer 707.

Next, a mask is selectively formed on a top surface, and then part of the n-type AlGaN layer 706 is exposed using, for example, a dry-etching method. Here, a region on the p-type AlGaN layer 707 positioned under the gate electrode 713 of the EFET is masked and not dry-etched.

Next, another mask is selectively formed, and then part of the p$^+$-type GaN layer 703 is exposed using the same method.

Next, the isolation regions 708 are formed by ion-implanting, for example, B. Subsequently, the source electrode 709, the drain electrode 711, the source electrode 712, the drain electrode 714, and the base electrode 716 made of, for example, Ti and Al are formed on the n-type AlGaN layer 706 by an electron-beam evaporation method and a lift-off method followed by an ohmic sintering thermal treatment. Here, the source electrode 709, the drain electrode 711, the source electrode 712, the drain electrode 714, and the base electrode 716 may be formed after removing all or part of the n-type AlGaN layer 706 using, for example, a dry-etching method.

Next, the gate electrode 710 made of, for example, Pd is formed on the n-type AlGaN layer 706 using, for example, an electron-beam evaporation method and a lift-off method. The gate electrode 713 made of, for example, Pd is formed on the p-type AlGaN layer 707 in the same manner. The emitter electrode 715 made of, for example, Pd is formed on the p-type AlGaN layer 707 in the same manner. The collector electrode 717 made of, for example, Pd is formed on the p$^+$-type GaN layer 703 in the same manner.

This is a manufacturing process of the semiconductor device 700 shown in FIG. 7. It is possible to set a threshold voltage of the HFET of the Bi-FET as necessary through control of the threshold voltage by biasing a provided back-gate electrode as shown in Modification 1 of Embodiment 1 or Modification 1 of Embodiment 2. This still allows manufacturing a Bi-FET including a DFET and an EFET without increasing process steps.

Although the semiconductor devices according to the present invention have been described with reference to the embodiments above, the present invention is not limited these embodiments.

For example, FIGS. 1 to 7 merely show schematic structures of the semiconductor devices according to the present invention. Modifications of these structures for manufacturing reasons are still included within the scope of the present invention. For example, vertical and horizontal edges of components shown in the drawings may slant at predetermined degrees from the vertical or the horizontal. Corners and edges of the components having a right angle in the drawings may be rounded at least in part.

Although field-effect transistors have been described using HFETs as examples, the field-effect transistor may be field-effect transistors of other types such as a MISFET, a MOSFET, A JFET, and a MESFET.

It is also possible to combine at least a part of the semiconductor devices according to Embodiments 1 to 3 and modifications thereof.

INDUSTRIAL APPLICABILITY

The present invention is applicable to semiconductor devices and, in particular, to Bi-FETs to be used with mobile phones.

What is claimed is:

1. A semiconductor device comprising:
a substrate;
a nitride semiconductor layer formed above said substrate and having a laminated structure including at least three layers;
a heterojunction bipolar transistor formed in a region of said nitride semiconductor layer; and
a field-effect transistor formed in a region of said nitride semiconductor layer, the region being different from the region in which said heterojunction bipolar transistor is formed,
wherein said nitride semiconductor layer includes:
a first nitride semiconductor layer formed above said substrate;
a second nitride semiconductor layer formed on said first nitride semiconductor layer; and
a third nitride semiconductor layer formed on said second nitride semiconductor layer, and
said semiconductor device further comprises:
an isolation region which separates each of said first nitride semiconductor layer, said second nitride semiconductor layer, and said third nitride semiconductor layer into a first region in which said heterojunction bipolar transistor is formed and a second region in which said field-effect transistor is formed, said first region and said second region being electrically isolated from each other,
a collector electrode of said heterojunction bipolar transistor is electrically connected to said first nitride semiconductor layer in said first region,
a base electrode of said heterojunction bipolar transistor is electrically connected to said second nitride semiconductor layer in said first region,
an emitter electrode of said heterojunction bipolar transistor is electrically connected to said third nitride semiconductor layer in said first region,
a source electrode and a drain electrode of said field-effect transistor are electrically connected to one of said first nitride semiconductor, said second nitride semiconductor layer, and said third nitride semiconductor layer in said second region, and
a gate electrode of said field-effect transistor is formed on one of said first nitride semiconductor, said second nitride semiconductor layer, and said third nitride semiconductor layer in said second region.

2. The semiconductor device according to claim 1,
wherein said first nitride semiconductor layer has n-type conductivity,
said second nitride semiconductor layer has p-type conductivity,
said third nitride semiconductor layer includes:
a fourth nitride semiconductor layer formed on said second nitride semiconductor layer; and
a fifth nitride semiconductor layer formed on said fourth nitride semiconductor layer, said fifth nitride semiconductor layer having a wider bandgap than said fourth nitride semiconductor layer,
said source electrode and said drain electrode are electrically connected to said third nitride semiconductor layer in said second region, and
said gate electrode is formed on said fifth nitride semiconductor layer in said second region.

3. The semiconductor device according to claim 2,
wherein said second nitride semiconductor layer includes $In_xGa_{1-x}N$, where $0 \leq x \leq 1$.

4. The semiconductor device according to claim 2,
wherein said fourth nitride semiconductor layer includes GaN, and
said fifth nitride semiconductor layer includes AlGaN.

5. The semiconductor device according to claim 2,
wherein said third nitride semiconductor layer has a thickness of 50 nm or less.

6. The semiconductor device according to claim 2, further comprising
a backgate electrode of said field-effect transistor, said backgate electrode being electrically connected to said second nitride semiconductor layer in said second region.

7. The semiconductor device according to claim 2,
wherein said first nitride semiconductor layer includes:
a low-concentration region in contact with said second nitride semiconductor layer and not in contact with said collector electrode; and
a high-concentration region in contact with said collector electrode, said high-concentration region including dopants at a higher concentration than said low-concentration region.

8. The semiconductor device according to claim 2,
wherein, in said first region, said third nitride semiconductor layer is in contact with said emitter electrode and includes a low-resistance region which includes n-type dopants at a concentration higher than a concentration of n-type dopants included in said second region of said third nitride semiconductor layer.

9. The semiconductor device according to claim 1,
wherein said first nitride semiconductor layer and said third nitride semiconductor layer have p-type conductivity,
said second nitride semiconductor layer includes:
a fourth nitride semiconductor layer formed on said first nitride semiconductor layer; and
a fifth nitride semiconductor layer formed on said fourth nitride semiconductor layer, said fifth nitride semiconductor layer having a wider band gap than said fourth nitride semiconductor layer,
said source electrode and said drain electrode are electrically connected to said second nitride semiconductor layer in said second region, and
said gate electrode is formed on said third nitride semiconductor layer or on said fifth nitride semiconductor layer in said second region.

10. The semiconductor device according to claim 9,
wherein said fourth nitride semiconductor layer includes GaN, and
said fifth nitride semiconductor layer includes AlGaN.

11. The semiconductor device according to claim 9,
wherein said second nitride semiconductor layer has a thickness of 50 nm or less.

12. The semiconductor device according to claim 9,
wherein said third nitride semiconductor layer includes $Al_yGa_{1-y}N$, where $0 \leq y \leq 1$.

13. The semiconductor device according to claim 9, further comprising
a backgate electrode of said field-effect transistor, said backgate electrode being electrically connected to said first nitride semiconductor layer in said second region.

14. The semiconductor device according to claim 9,
wherein said first nitride semiconductor layer includes:
a low-concentration region in contact with said second nitride semiconductor layer and not in contact with said collector electrode; and a high-concentration region in contact with said collector electrode, said high-concentration region including dopants at a higher concentration than said low-concentration region.

15. The semiconductor device according to claim 9, wherein said third nitride semiconductor layer includes:
    a sixth nitride semiconductor layer formed on said second nitride semiconductor layer; and
    a seventh nitride semiconductor layer formed on said sixth nitride semiconductor layer, said seventh nitride semiconductor layer having a narrower bandgap than said sixth nitride semiconductor layer.

16. The semiconductor device according to claim 9, wherein said field-effect transistor includes:
    a depletion-mode field-effect transistor and an enhancement-mode field-effect transistor,
    said second region includes a third region in which said depletion-mode field-effect transistor is formed and a fourth region in which said enhancement-mode field-effect transistor is formed, said third region and said fourth region being electrically isolated from one another,
    a collector electrode of said heterojunction bipolar transistor is electrically connected to said first nitride semiconductor layer in said first region,
    a base electrode of said heterojunction bipolar transistor is electrically connected to said second nitride semiconductor layer in said first region,
    an emitter electrode of said heterojunction bipolar transistor is electrically connected to said third nitride semiconductor layer in said first region,
    a source electrode and a drain electrode of said depletion-mode field-effect transistor are electrically connected to said second nitride semiconductor layer in said third region,
    a gate electrode of said depletion-mode field-effect transistor is formed on said fifth nitride semiconductor layer in said third region,
    a source electrode and a drain electrode of said enhancement-mode field-effect transistor are electrically connected to said second nitride semiconductor layer in said fourth region, and
    a gate electrode of said enhancement-mode field-effect transistor is formed on said third nitride semiconductor layer in said fourth region.

17. A semiconductor device comprising:
    a substrate;
    a nitride semiconductor layer formed above said substrate and having a laminated structure including at least three layers;
    a heterojunction bipolar transistor formed in a region of said nitride semiconductor layer; and
    a field-effect transistor formed in a region of said nitride semiconductor layer, the region being different from the region in which said heterojunction bipolar transistor is formed,
    wherein plural field-effect transistors including said field-effect transistor are provided in the semiconductor device, and
    said plural field-effect transistors include a depletion-mode field-effect transistor and an enhancement-mode field-effect transistor.

18. The semiconductor device according to claim 17, wherein said nitride semiconductor layer includes:
    a first nitride semiconductor layer formed above said substrate;
    a second nitride semiconductor layer formed on said first nitride semiconductor layer; and
    a third nitride semiconductor layer formed on said second nitride semiconductor layer, and
    said semiconductor device further comprises:
    an isolation region which separates each of said first nitride semiconductor layer and said second nitride semiconductor layer into a first region in which said heterojunction bipolar transistor is formed, a second region in which said depletion-mode field-effect transistor is formed, and a third region in which said enhancement-mode field-effect transistor is formed, said first region, said second region, and said third region being electrically isolated from one another,
    a collector electrode of said heterojunction bipolar transistor is electrically connected to said first nitride semiconductor layer in said first region,
    a base electrode of said heterojunction bipolar transistor is electrically connected to said second nitride semiconductor layer in said first region,
    an emitter electrode of said heterojunction bipolar transistor is electrically connected to said third nitride semiconductor layer in said first region,
    a source electrode and a drain electrode of said depletion-mode field-effect transistor are electrically connected to said second nitride semiconductor layer in said second region,
    a gate electrode of said depletion-mode field-effect transistor is formed on said second nitride semiconductor layer in said second region,
    a source electrode and a drain electrode of said enhancement-mode field-effect transistor are electrically connected to said second nitride semiconductor layer in said third region, and
    a gate electrode of said enhancement-mode field-effect transistor is formed on said third nitride semiconductor layer in said third region.

* * * * *